United States Patent
Gautam et al.

(10) Patent No.: US 9,601,188 B1
(45) Date of Patent: Mar. 21, 2017

(54) METHOD, APPARATUS AND SYSTEM FOR TARGETED HEALING OF STABILITY FAILURES THROUGH BIAS TEMPERATURE INSTABILITY

(71) Applicant: GLOBALFOUNDRIES INC., Grand Cayman (KY)

(72) Inventors: Akhilesh Gautam, Sunnyvale, CA (US); Randy W. Mann, Milton, NY (US); William McMahon, Scarsdale, NY (US); Yoann Mamy Randriamihaja, Troy, NY (US); Yuncheng Song, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/047,139

(22) Filed: Feb. 18, 2016

(51) Int. Cl.
  *G11C 11/00* (2006.01)
  *G11C 11/419* (2006.01)
(52) U.S. Cl.
  CPC .................................. *G11C 11/419* (2013.01)
(58) Field of Classification Search
  CPC ....... H01L 2924/00; H01L 2224/32225; H01L 2224/48227; H01L 2224/73265; H01L 2924/00014; H01L 2224/16225; H01L 2224/45124; H01L 2224/73204; H01L 2924/15311; H01L 2924/00015; H01L 2224/131; H01L 2224/32145; H01L 2224/4514
  USPC .. 365/154, 201, 203, 156, 226, 189.09, 190, 365/205, 230.06, 185.25, 189.011, 227, 365/229, 230.05, 100, 104, 148, 149, 151
  See application file for complete search history.

(56) References Cited

U.S. PATENT DOCUMENTS

2007/0291528 A1* 12/2007 Hanafi ..................... G11C 7/02
                                                              365/154

* cited by examiner

*Primary Examiner* — Thong Q Le
(74) *Attorney, Agent, or Firm* — Williams Morgan, P.C.

(57) ABSTRACT

We disclose methods, apparatus, and systems for improving semiconductor device yield and/or reliability through bias temperature instability (BTI). One device may comprise a plurality of cells of an array, wherein each of the cells comprises a pass gate and a latch; a plurality of word lines, wherein each word line controls access to each pass gate of a first number of cells; a word line driver electrically connected to each word line; a row decoder configured to authorize or deauthorize a write voltage to each word line through the word line driver, wherein the write voltage is selected from an operational write voltage or a first write voltage; and a control line configured to provide an operational write voltage or a first write voltage to each word line authorized by the row decoder, wherein the first write voltage is greater than an operational write voltage.

19 Claims, 7 Drawing Sheets

METHOD, APPARATUS AND SYSTEM FOR TARGETED HEALING OF STABILITY FAILURES THROUGH BIAS TEMPERATURE INSTABILITY

BACKGROUND OF THE INVENTION

Field of the Invention

Generally, the present disclosure relates to the manufacture and use of sophisticated semiconductor devices, and, more specifically, to various methods, structures, and systems for improving the yield and/or reliability of semiconductor devices by exploitation of bias temperature instability (BTI).

Description of the Related Art

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Generally, a set of processing steps is performed on a group of semiconductor wafers, sometimes referred to as a lot, using semiconductor-manufacturing tools, such as exposure tool or a stepper. As an example, an etch process may be performed on the semiconductor wafers to shape objects on the semiconductor wafer, such as polysilicon lines, each of which may function as a gate electrode for a transistor. As another example, a plurality of metal lines, e.g., aluminum or copper, may be formed that serve as conductive lines that connect one conductive region on the semiconductor wafer to another. In this manner, integrated circuit chips may be fabricated.

Bias temperature instability (BTI) remains as one of the key reliability concerns in advanced complementary metal-oxide-semiconductor (CMOS) nodes, such as those used in static random access memory (SRAM). Generally, BTI arises when a voltage is applied to one or more transistors or other elements of a device incorporating CMOS technologies, i.e., during normal device operation. Over time, BTI tends to weaken the drive strength of the transistor. Of further concern in multi-element devices, such as, for example, six-transistor (6T) SRAMs, is that unequal extents of BTI between different elements may lead to imbalances between writability and read-stability (one cause of which is BTI shifts) that reduce yield of the circuit element more than would be expected from simply considering each BTI-undergoing element in isolation.

Field failures due to stress induced device shifts attributable to the BTI mechanism continue to plague very-large-scale integration (VLSI) CMOS technologies. Over product life time the Vmin is known to increase in large SRAM arrays due to negative bias temperature instability (NBTI) and more recently positive bias temperature instability (PBTI) combined with NBTI. SRAM arrays are particularly vulnerable due to the increased number of bits with each generation and use of minimum transistor size for maximum bit density.

The random nature of the BTI mechanism leaves large arrays vulnerable to BTI induced failures over the life time of the product. Therefore, BTI induced voltage sensitive failures in advanced VLSI SRAM arrays are expected to remain one of the key technology reliability concerns for the foreseeable future.

The industry has adopted voltage-guard-bands as the principle means to compensate for expected end of life BTI shifts. Though accepted, voltage-guard-bands are costly with limitations in effectiveness.

Therefore, it would be desirable to have solutions to the problem of BTI shifts that are relatively inexpensive, readily fabricated, and effective.

The present disclosure may address and/or at least reduce one or more of the problems identified above regarding the prior art and/or provide one or more of the desirable features listed above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods, apparatus, and systems, such as a semiconductor device comprising a plurality of cells of an array, wherein each of the cells comprises a pass gate and a latch; a plurality of word lines, wherein each word line controls access to each pass gate of a first number of cells; a word line driver electrically connected to each word line; a row decoder configured to authorize or deauthorize a write voltage to each word line through the word line driver, wherein the write voltage is selected from an operational write voltage or a first write voltage; and a control line configured to provide an operational write voltage or a first write voltage to each word line authorized by the row decoder, wherein the first write voltage is greater than an operational write voltage The present disclosure is also directed to methods of improving the yield and/or reliability of semiconductor devices by use of bias temperature instability (BTI). One such method comprises determining a number of stability failures for a plurality of cells in each word line of an array, wherein each of the cells comprises a pass gate and a latch; and applying, in response to the number of stability failures in each word line of the first subset being greater than a first threshold, a first write voltage to the pass gate of each cell in a first subset of the word lines for a first duration, wherein the first write voltage is greater than an operational write voltage of the cell.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

RELATED APPLICATIONS

The following applications filed the same date as the instant application are hereby incorporated by reference herein. Ser. No. 15/046,983, entitled "Method, Apparatus, And System For Global Healing of Stability-Limited Die Through Bias Temperature Instability," Ser. No. 15/047,271, entitled "Method, Apparatus, And System For Global Healing Of Write-Limited Die Through Bias Temperature Instability," and Ser. No. 15/047,395, entitled "Method, Apparatus, And System For Targeted Healing Of Write Fails Through Bias Temperature Instability."

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for improved yield and/or reliability of semiconductor devices by use of bias temperature instability (BTI).

Figure 1:
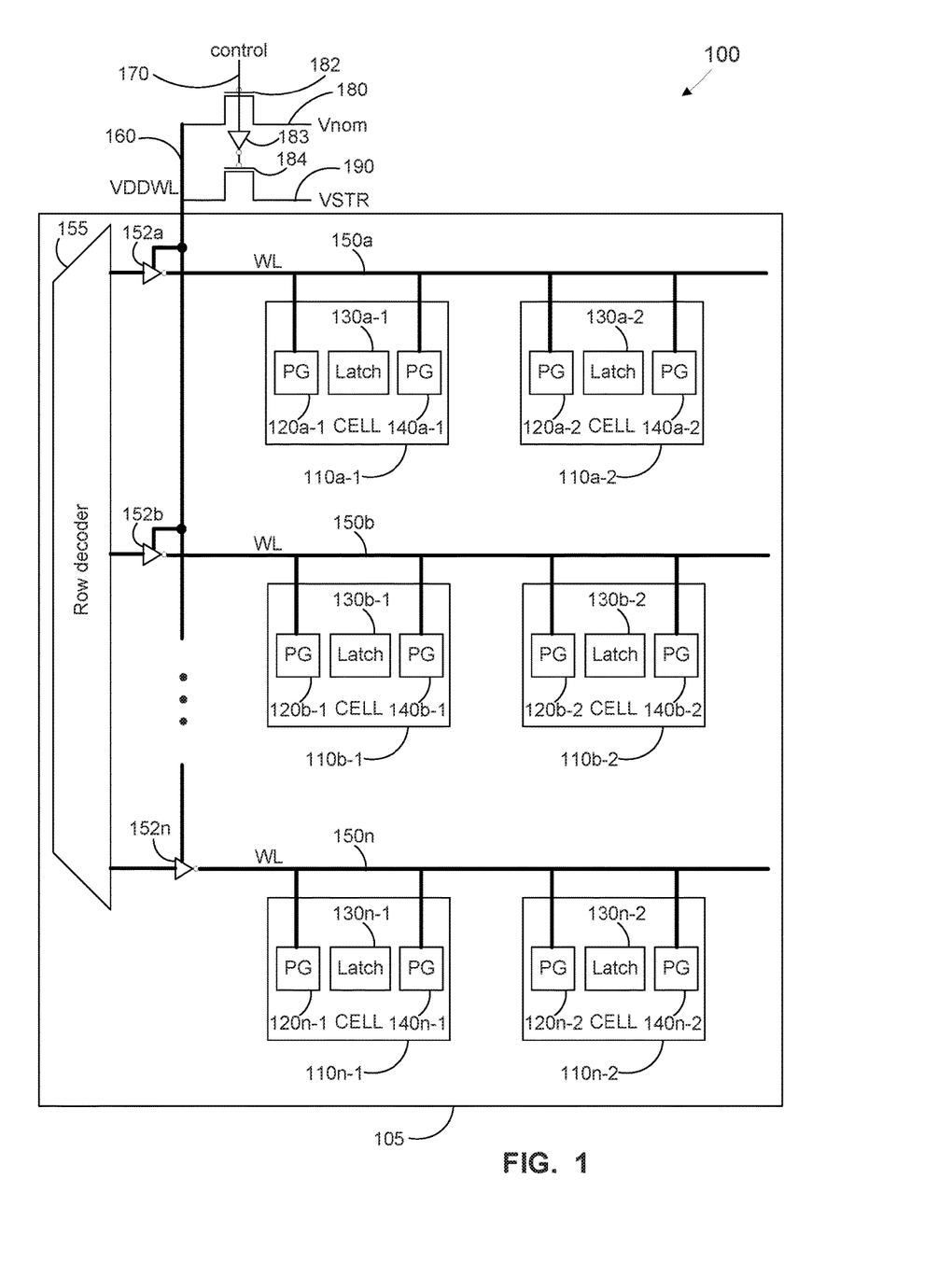
FIG. 1 illustrates a stylized depiction of a semiconductor device in accordance with embodiments herein.

Turning now to FIG. 1, we present a stylized depiction of a semiconductor device 100 in accordance with embodiments herein. As shown, the semiconductor device 100 comprises an array 105. The array 105 comprises a plurality of cells 110a-1 through 110n-2 (collectively "110"). Each of the cells 110 comprises at least one pass gate (PG) 120 and a latch 130. The depicted embodiment shows each of the cells 110 comprising a second PG 140, though it should be noted in other embodiments, the cells 110 may only comprise a single PG, and that no claim is limited to the particular embodiment depicted in FIG. 1 unless a second pass gate is explicitly recited by that claim.

The semiconductor device 100 also comprises a plurality of word lines (WL) 150. Each word line (150a, 150b, . . . 150n) controls access to each pass gate 120 of a first number of cells 110. In the depicted embodiment, word line 150a controls access to pass gate 120a-1 of cell 110a-1 and pass gate 120a-2 of cell 120a-2. The word line 150a also controls access to pass gate 140a-1 of cell 110a-1 and pass gate 140a-2 of cell 120a-2. As can be seen, the suffixed letter of each word line 150 reference numeral (e.g., a, b, . . . n) controls access to pass gates having the same suffixed letter of each pass gate 120 or pass gate 140 reference numeral. The various cells 110 whose pass gates 120 or 140 are controlled by one word line 150a, 150b, . . . 150n have the same suffixed letter as the word line 150a, 150b, . . . 150n and an incremented suffixed numeral -1 or -2.

Although FIG. 1 depicts one word line, e.g., word line 150a, controlling access to the pass gates 120a and 140a of two cells 110a-1 and 110a-2, the person of ordinary skill in the art will appreciate that more than two cells 110 may have access to their pass gates 120 and 140 controlled by a single word line 150. For example, in embodiments wherein the cell 110 is an SRAM cell, from two to sixty-four cells 110, for example, two, four, six, eight, sixteen, thirty-two, or sixty-four cells 110, or more generally, $2^x$ cells 110, wherein x is a counting number, may have access to their pass gates 120 and 140 controlled by a single word line 150. In one embodiment, eight cells 110 have access to their pass gates 120 and 140 controlled by a single word line 150.

Similarly, although FIG. 1 depicts three word lines 150a, 150b, and 150n, the person of ordinary skill in the art will appreciate that any number of word lines 150 may be included in the array 105. For example, in embodiments wherein the array 105 comprises SRAM cells, such an array may comprise eleven word lines. Greater or lesser numbers of word lines may be present, depending on the desired use of the array and considerations relating to manufacturing complexity, among other considerations that will be apparent to the person of ordinary skill in the art.

As shown in FIG. 1, the semiconductor device 100 may comprise a row decoder 155, and access to each word line 150 may be controlled by word line driver element 152a, 152b, ... 152n. In the depicted semiconductor device 100, pre-decoded addresses on word lines 150a, 150b, 150n may be accessed, e.g., may be written to using either an operational voltage (Vnom 180) or a first write voltage (VSTR 190).

Figure 2:
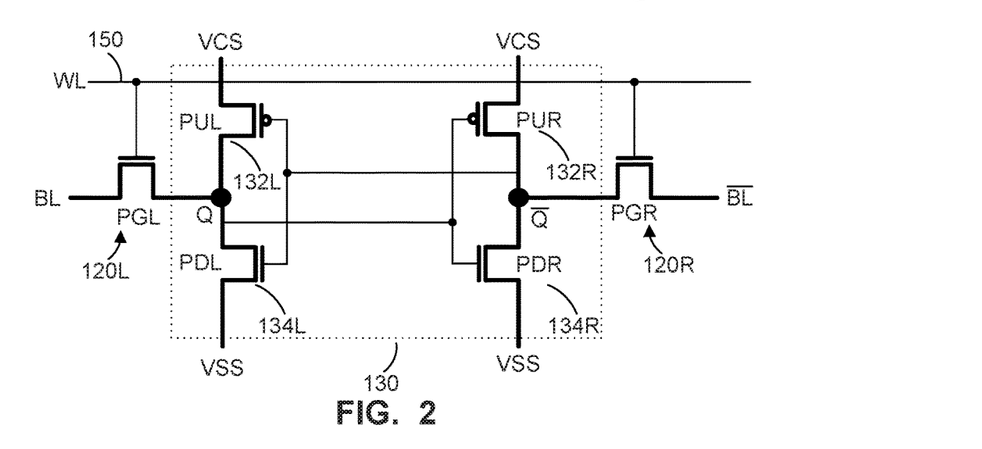
FIG. 2 illustrates a stylized depiction of a six-transistor (6T) static random access memory (SRAM) cell in accordance with embodiments herein.

Turning to FIG. 2, an embodiment wherein the cell 110 is a six-transistor (6T) SRAM cell is depicted. As shown, word line 150 controls access to left pass gate (PGL) 120L and right pass gate (PGR) 120R. The other four transistors of the 6T SRAM cell make up the latch 130. The four transistors of the latch 130 are a pull up left (PUL) transistor 132L, a pull down left (PDL) transistor 134L, a pull up right (PUR) transistor 132R, and a pull down right (PDR) transistor 134R. The operation of a 6T SRAM cell to store a bit is well known and will not be discussed in detail at this time.

Returning to FIG. 1, the semiconductor device 100 comprises a word line driver 160 (VDDWL) electrically connected to each word line 150a, 150b, ... 150n. The word line driver 160 provides electrical current required for each word line 150 to write a bit to each pass gate 120 and 140 controlled by that word line 150.

The voltage provided by word line driver 160 to each word line 150a, 150b, ... 150n is controlled by row decoder 155, which in turn is controlled by a control line 170. The control line 170 may be configured to provide an operational write voltage (Vnom, supplied by line 180) or a first write voltage (VSTR, supplied by line 190) to row decoder 155 through the word line driver 160. In some embodiments, the control line 170 may be a built-in self-heal for reads (BISHR) line, by which is meant a line that controls whether the semiconductor device 100 implements a self-healing process for correcting read or stability errors in one or more cells 110 of array 105.

In the depicted embodiment, if control line 170 is deasserted (e.g., if BISHR=0), then the gate of operational write voltage transistor 182 is open and current flows from Vnom 180 through operational write voltage transistor 182 to word line driver 160. Inverter 183 passes an assertion to first write voltage transistor 184, which closes the gate of first write voltage transistor 184, thereby preventing current flow from VSTR 190 to word line driver 160. Thus, if control line 170 is deasserted, each word line 150a, 150b, ... 152n of array 105 receives the operational write voltage if the row decoder 155 authorizes a write to corresponding word line driver element 152a, 152b, ... 152n, or receives no voltage if the row decoder 155 deauthorizes a write to corresponding word line driver element 152a, 152b, ... 152n.

On the other hand, if control line 170 is asserted (e.g., if BISHR=1), then the gate of operational write voltage transistor 182 is closed, and current flow from Vnom 160 is prevented. Inverter 183 passes a deassertion to first write voltage transistor 184, which opens the gate of first write voltage transistor 184, thereby allowing current flow from VSTR 190 to word line driver 160. Thus, if control line 170 is asserted, each word line 150a, 150b, ... 152n of array 105 receives the first write voltage if the row decoder 155 authorizes a write to corresponding word line driver element 152a, 152b, ... 152n, or receives no voltage if the row decoder 155 deauthorizes a write to corresponding word line driver element 152a, 152b, ... 152n.

Although a particular arrangement of transistors 182 and 184 and inverters 183 is depicted in FIG. 1, the person of ordinary skill in the art, having the benefit of the present disclosure, will be able to construct alternative arrangements of logic gates whereby a control line may provide an operational write voltage or a first write voltage to each word line of a plurality of cells in an array through a word line driver.

The present disclosure is not limited to any particular value of the operational write voltage (Vnom 180) or the first write voltage (VSTR 190). In one embodiment, the operational write voltage may be about 1.0 V and the first write voltage may be from about 1.1V to about 1.6V. In relative terms, in one embodiment, the first write voltage may be from about 1.1 times the operational write voltage to about 1.8 times the operational write voltage.

Though not to be bound by theory, turning to FIGS. 3-7, we review how to significantly reduce the vulnerability to BTI fails. By controlled selective bias of targeted failing bits, fails or shifts in Vmin can be rectified. This is accomplished with existing array design architectures using only the existing built in terminals (BL, $\overline{BL}$, WL, VCS and VSS).

The concepts required for "healing" of failed or failing bits in large SRAM arrays on advanced CMOS nodes are discussed and demonstrated with both (20 nm and 14 nm) hardware. As scaling continues below 20 nm, greater than 500 Mb of SRAM on a die is not uncommon. The migration to FinFET devices and the lithographic challenges in printing and controlling the dimensions has become increasingly difficult. The 6T SRAM bit cell is a common feature of contemporary semiconductor devices and SRAM bit cell area is a benchmark of technology competitiveness in today's VLSI microelectronics industry.

A significant source of variation in nanoscale CMOS technologies is associated with random dopant fluctuations (RDF), which follow a $1/\sqrt{WL}$ relationship. Although high-k/metal gate technologies have provided some relief, aggressive design rule and device scaling has led to an increase in device variation in both SRAM and logic devices. Because it is common for the SRAM devices to be near or below minimum logic design rules, the RDF mismatch phenomenon is exacerbated. Additionally, pushed design spacing rules used in the dense SRAM cell can lead to added sources of variation that is not observed in circuits designed with the standard logic design rules. These factors among others coupled with additional variation and within-cell asymmetric shifts associated with BTI result in heightened vulnerability for the SRAM.

Positive BTI (PBTI) and negative BTI (NBTI) can be expressed as follows.

$$PBTI \Delta Vt(\text{yr}, Vg, T) := \\ A \cdot mV \cdot \exp\left[\frac{Ea}{k2 \cdot (273 \cdot K + T)}\right] \cdot \left(\frac{Vg}{tinv}\right)^m \cdot tt(\text{yr} \cdot df)^n \cdot W^\beta \cdot L^\alpha$$

$$NBTI \Delta Vt(\text{yr}, Vg, T) := \\ Ap \cdot mV \cdot \exp\left[\frac{Eap}{k2 \cdot (273 \cdot K + T)}\right] \cdot \left(\frac{Vg}{tinvp}\right)^{mp} \cdot tt(\text{yr} \cdot df)^{np} \cdot Wp^{\beta p} \cdot Lp^{\alpha p}$$

Figure 3:
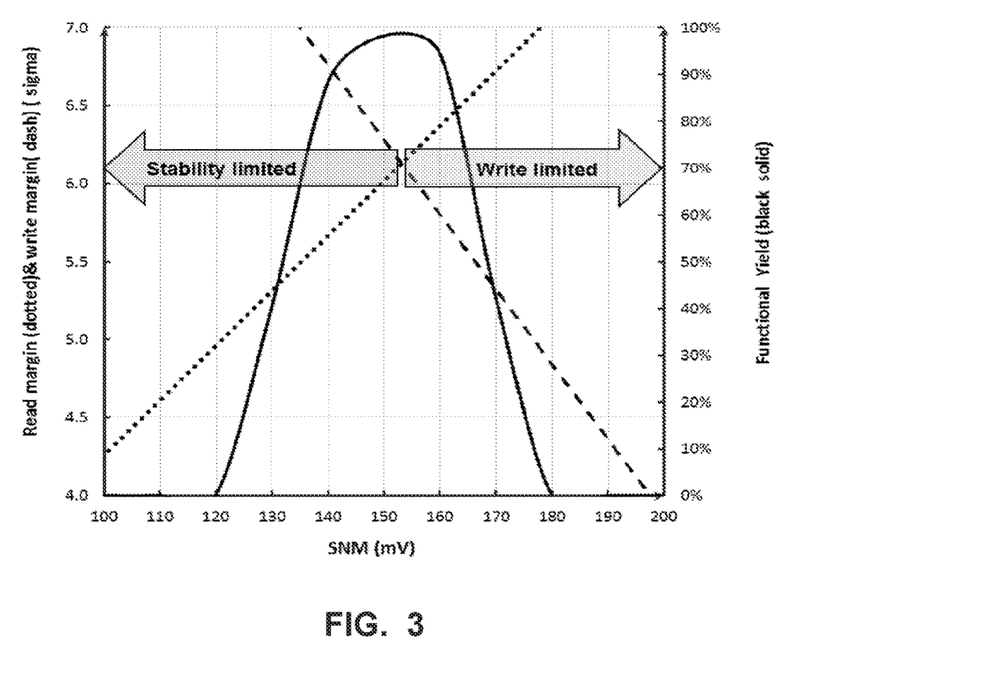
FIG. 3 illustrates the yield, the writability sigma, and the read-stability sigma as a function of SNM for a typical 6T SRAM cell in accordance with embodiments herein.

The 6T SRAM cell design and functionality relies on a balance between maintaining the ability to write and ability to maintain state. This intrinsic trade-off is represented in FIG. 3 which illustrates with yield (solid line) and sigma (dashed lines) the balance between stability and write margin. The maximum yield is obtained when these are balanced. Maintaining this balance fundamentally relies on device targeting and maintaining a tight control of both local and global variation for the transistors. Although RDF remains a large source of variation (even with FinFET devices that rely on halo and channel doping to target the threshold), over the lifetime of the product, the increased variation attributable to BTI is also a factor.

Figure 4:
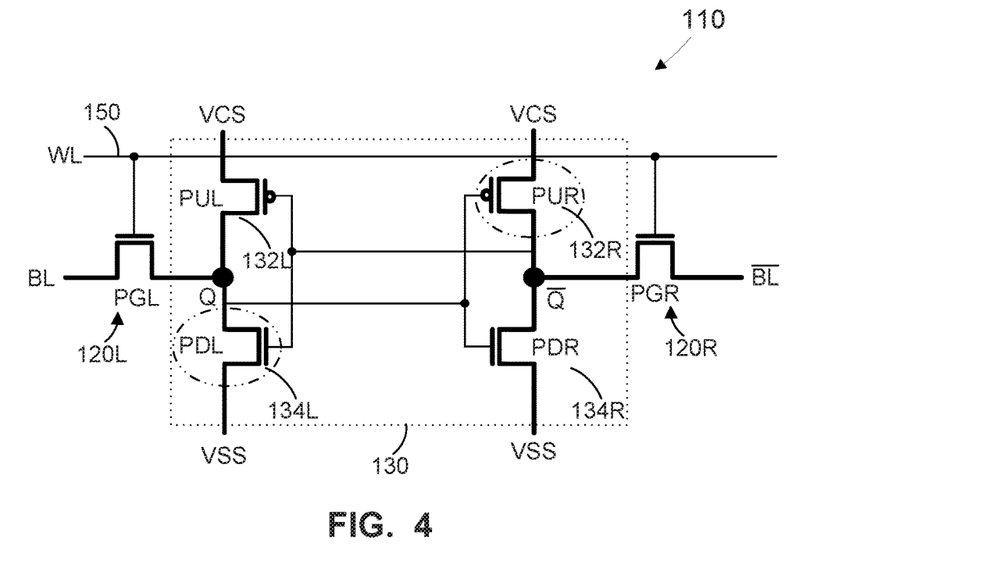
FIG. 4 illustrates a stylized depiction of a 6T SRAM cell in accordance with embodiments herein.

FIG. 4 illustrates the devices within cell 110 being stressed when the array is powered on in the situation where Q is low and $\overline{Q}$ is high. It is clear that the PUR 132R and PDL 134L devices of latch 130 are continuously experiencing bias consistent with the BTI stress condition. Specifically, in this situation, PDL experiences PBTI and PUR experiences NBTI. The state of the bit governs which pair of PD/PU devices is receiving the BTI bias conditions. In the situation where Q is high and $\overline{Q}$, is low, PUL 132L and PDR 134R undergo BTI.

Over the product lifetime, the bits may be expected to switch, and thus the amount of time spent in one state (e.g., Q low and $\overline{Q}$ high) is only a fraction of the total lifetime. If the fraction is close to 50%, the mean net shift is on both pairs would be approximately the same, which may support the balance between writability and read-stability. However, in actual practice, the fraction is rarely close to 50% for several reasons. The actual fraction of time any individual bit is holding a specific state can be a source of error in predicting the voltage-guard-band needed for a product. In practice the fraction of SRAM bits storing a 0 state is typically somewhat higher by several percent compared to bits storing a 1 state. The result is a significant fraction of the bits in the array will see an uneven stress so that the PDL and PUR latch devices may see far more BTI stress than the PDR and PUL in the same bit.

To gain performance, it has become common industry practice to overdrive the voltage which exacerbates the BTI impact. This impacts the SRAM for each terminal (VCS/WL/NW and BL) unless specific voltage domains are included for the SRAM.

The voltage-guard-band is used throughout the VLSI CMOS industry to provide a buffer for expected Vmin shifts associated with the BTI mechanism. As discussed above, this approach is both costly and has limitations in its ability to capture rogue bit shifts. The typical guard band may be 50 mV or more depending on the anticipated device shifts over the product life. In addition to the BTI voltage-guard-band, it is common practice to add additional voltage-guard-bands to account for tester variability and other noise sources, such as IR drop and potentially random telegraph noise (RTN). The inclusion of voltage-guard-bands further complicates SRAM array fabrication, requiring further testing to ensure devices meet specifications. As a result of the guard-band approach, many potentially good die are discarded costing fabs millions in revenue each year.

By using an extended write or repeat write with elevated WL voltage the Vt of the PG device can be increased by the PBTI mechanism, by selectively raising the PG device Vt on the selected bits.

Once a bit is deemed to have reduced stability by failing or by the fact that it is the bit limiting the Vmin of the array, it is crucial to know the state in which the bit is unstable. For example, if the bit is failing when storing a 0 on node Q, to improve the stability of this bit, the controlled biasing scheme, using the write circuitry and elevated WL bias would be used so that the PGL device 120L of cell 110 is subject to PBTI stress.

In the on state condition for the SRAM array 105, the latch devices 130 for the entire array 105 of SRAM bits 110 are continuously biased and subject to BTI induced shifts. This leads to a mean shift in the pull-up (PU) and pull-down (PD) devices over time which leads to reduced stability. The wordline or (PG) devices are largely unimpacted due to the significantly reduced stress time. Because of this, over time in an HTOL or in the field, the latch 110 stability becomes weaker (relative to the PG 120).

The controlled bias write step could be exercised multiple times (word selections may be varied but would contain this bit) to reduce PBTI shifts in bits on the same WL 150. In practice, 5-15 mV positive shifts in Vtsat will be expected to sufficiently restore a bit. It is recognized that other PG devices 120 along the WL 150 will also experience a shift. This can be minimized by writing multiple times and exchanging word (keeping the target bit constant). Alternatively, as was done in the experiments described herein, the other PG devices 120 on the same WORD 150 are allowed to be impacted, reducing read or write performance for a limited number of bits 110 on the selected WL 150. Even so, only a tiny fraction of bits 110 from the entire array 105 will experience a small net degrade in read and write performance.

Using the existing VLSI architecture for SRAM arrays 105, sufficient ports are available to apply the biases needed to achieve the desired stresses. Read and write operations along with addressable bit selection exist and may be exploited to heal bits via BTI.

While the read operation does not provide the desired BTI stress conditions, the addressable write condition is well suited to achieve the desired PBTI stress for the PG devices 120. During normal use conditions while the array 105 is powered, two devices of latch 130 are continuously subject to BTI stress. Over the course of an HTOL stress or product life, these devices of latch 130 become weaker due to BTI. With an elevated WL 150 voltage and extended write time or multiple writes to the target bit, sufficient PG device 120 shifts can be obtained. The intentional positive shift in the PG 120 weakens the targeted PG device 120 so that it is matched with the devices of latch 130 in drive strength.

The voltages and times required to accomplish the recovery of Vmin are less than the typical dynamic voltage screen (DVS) [typically 1.6-1.8 times Vnom] and hence pose no significant threat to the integrity of the small fraction of devices experiencing the elevated voltage. By incorporating BIST to catch bits 110 that begin to show signs of weakness, the voltage and times required to restore the weakest bits 110 may be kept sufficiently low as to be non-consequential.

Figure 5:
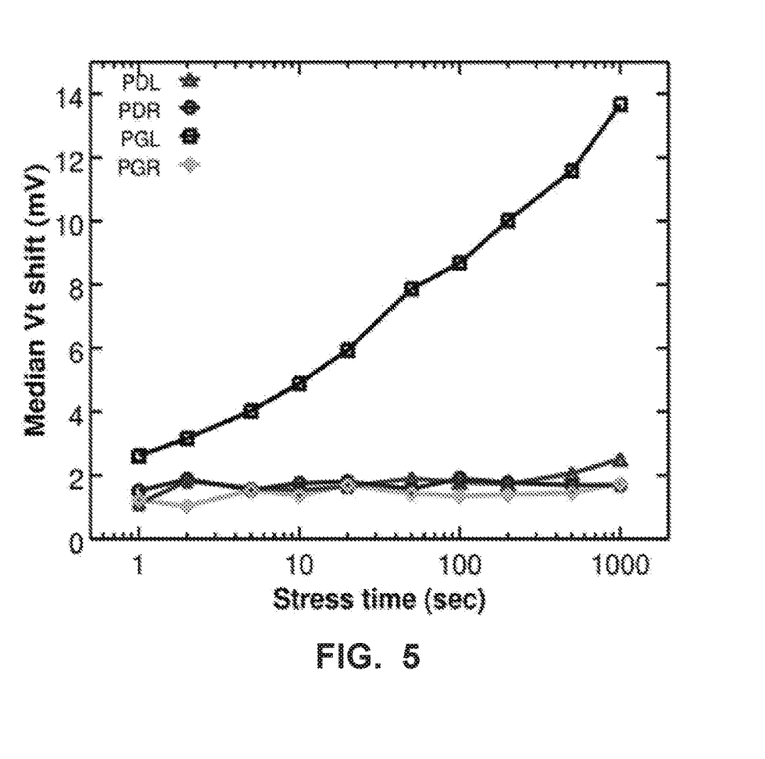
FIG. 5 illustrates change in Vtsat resulting from PBTI as a function of time for a pass gate of a 6T SRAM cell in accordance with embodiments herein.

Data shown in FIG. 5 using 20 nm hardware, was obtained at wafer level by biasing the WLs 150 in a mini-SRAM-array 105 at an elevated voltage (1.4V) with write times given in the x axis. This shows that as much as 3-4 mV of Vt shift was obtained with less than 5 seconds using the elevated WL 150 voltage.

Figure 6:
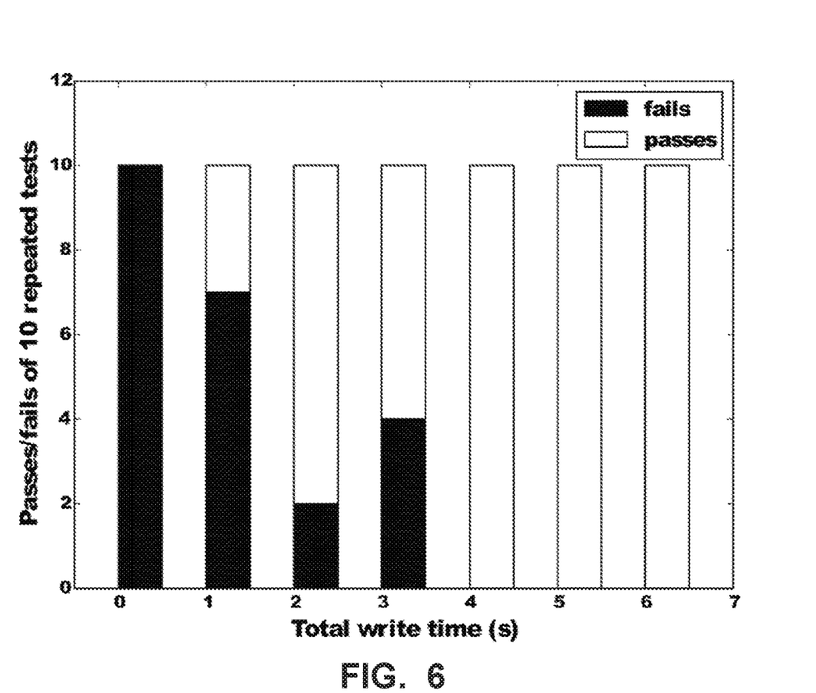
FIG. 6 illustrates in-situ recovery of stability (ADM) by writing elevated voltage to pass gates of 6T SRAM cells of an array in accordance with embodiments herein.

With the concepts and validation experiments have been laid out in the previous sections, demonstration using a 128 Mb functional SRAM is discussed. A 20 nm technology 128 Mb SRAM module, identified as failing 0.8V Vmin with a single cell fail (SCF) after an HTOL-like stress of 1.4 times Vnom for 168 hours, was selected. The fail was determined to be a stability or 'read' failure. Because it was a read 0 fail, a write 0 operation was applied for 1 second intervals. As shown in FIG. 6, initially the part was subjected to 10 read operations at 0.8V and found to fail 10 of 10 or 100% of the read operations. After 4 seconds of writing 0 with 1.4 times Vnom on the WL 150, the part was found to have 0 fails of 10 read passes at 0.8V in the 128 Mb array. The expected PG 120 Vt shift was approximately 10-15 mV which reduced the PG 120 strength sufficiently to be properly balanced with the latch 130 strength.

This is to our knowledge the first working proof of concept demonstrating the concept working in a large functional SRAM array 105. This opens the door to in-situ recovery or healing of bits which fail in the field over the life of the product.

In summary, by exploiting the BTI mechanism, a selected bias induced healing of failing bits in VLSI SRAM functional arrays 105 has been demonstrated in both 20 nm and 14 nm nodes. We demonstrated a methodology to recover specific bits which failed or shifted in Vmin during an HTOL stress. Use of applied biases and times, on the order of those used in dynamic voltage screening, was shown to be effective in large functional SRAM arrays 105 using terminals available in such arrays. By use of this technique, coupled with BIST or error detection and minimal circuit overhead, it is possible to recover or "heal" or prevent BTI stress induced Vmin failures in the field.

Figure 7:
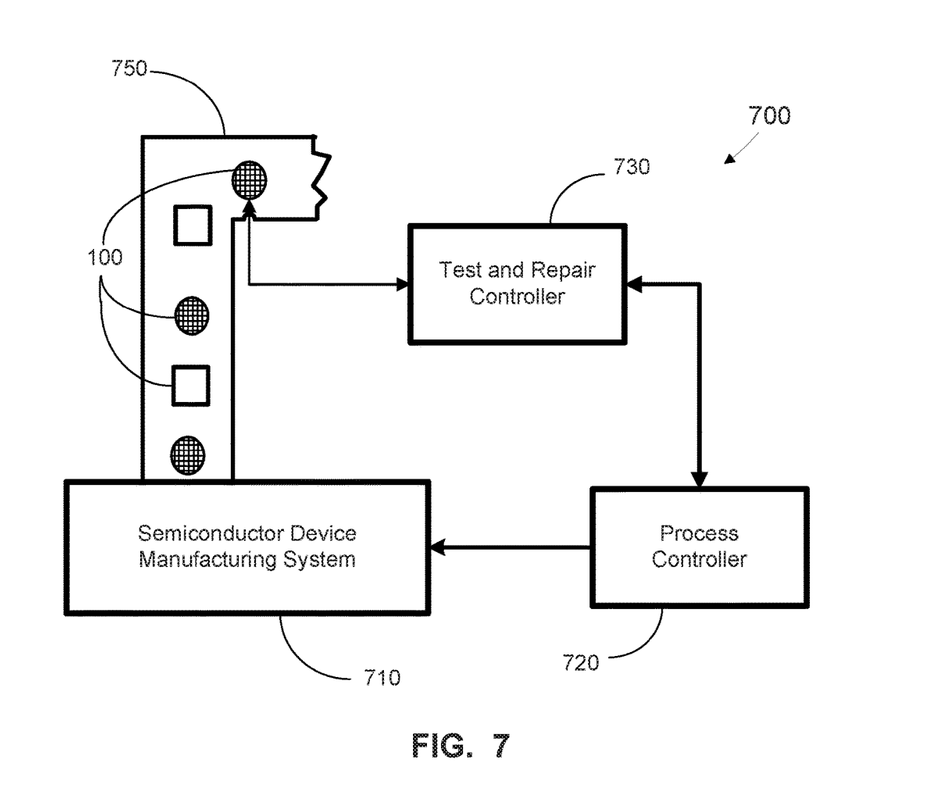
FIG. 7 illustrates a semiconductor device manufacturing system for manufacturing a device in accordance with embodiments herein.

Turning now to FIG. 7, a stylized depiction of a system 700 for fabricating a semiconductor device 100, in accordance with embodiments herein, is illustrated. The system 700 of FIG. 7 may comprise a semiconductor device manufacturing system 710 and a process controller 720. The semiconductor device manufacturing system 710 may manufacture semiconductor devices 100 based upon one or more instruction sets provided by the process controller 720. In one embodiment, the instruction set may comprise instructions to form a plurality of cells of an array, wherein each of the cells comprises a pass gate and a latch; form a plurality of word lines, wherein each word line controls access to each pass gate of a first number of cells; form a word line driver electrically connected to each word line; form a row decoder configured to authorize or deauthorize a write voltage to each word line through the word line driver, wherein the write voltage is selected from an operational write voltage or a first write voltage; and form a control line configured to provide an operational write voltage or a first write voltage to each word line authorized by the row decoder, wherein the first write voltage is greater than an operational write voltage.

The system 700 is not limited to particular details of the cells, the first number of cells, the number of cells in the array, the number of word lines in the device, the logic gates and related structures required for the row decoder and control line to provide an operational write voltage, a first write voltage, or no voltage to each word line through each corresponding word line driver. In one embodiment, each cell is a static random access memory (SRAM) cell, such as a six-transistor (6T) SRAM cell. In one embodiment, the first number of cells is two, four, six, eight, sixteen, thirty-two, or sixty-four.

The system 700 also comprises a test and repair controller 730. The test and repair controller 730 may be configured to determine a number of stability failures for a plurality of cells in each word line of an array, wherein each of the cells comprises a pass gate and a latch; and apply, in response to the number of stability failures in each word line of the first subset being greater than a first threshold, a first write voltage to the pass gate of each cell in a first subset of the word lines for a first duration, wherein the first write voltage is greater than an operational write voltage of the cell.

In one embodiment, the first write voltage may be from about 1.1 times the operational write voltage to about 1.8 times the operational write voltage. Independently, in one embodiment, the first duration may be from about 1 sec to about 8 sec. The specific time will be dependent on the technology, the temperature, and voltage.

The test and repair controller 730 may be configured to test one or more semiconductor devices 100 at any desired stage in processing. The test and repair controller 730 may also be configured to bidirectionally communicate with the process controller 720 regarding various aspects of processing. For example, the process controller 720 may communicate with the test and repair controller 730 to establish the value of the first threshold, the value of the first write voltage in either absolute terms or terms relative to the operational write voltage, the length of the first duration, and/or other parameters regarding the desired stability of the plurality of cells 110 in array 105 of semiconductor device 100. In the other direction, the test and repair controller 730 may communicate with the process controller 720 regarding test conditions and results, including number of stability failures, number of write failures, the ratio of number of stability failures to number of write failures, the value of the first threshold, the value of the first write voltage in either absolute terms or terms relative to the operational write voltage, the length of the first duration, and/or other parameters regarding the desired stability of the plurality of cells 110. The process controller 720 may make use of test condition and result data from the test and repair controller 730 in modifying one or more parameters of the instruction set provided to the semiconductor device manufacturing system 710, such that semiconductor devices 100 may be manufactured to have a greater likelihood of having a desired stability of the plurality of cells.

The semiconductor device manufacturing system 710 may comprise various processing stations, such as etch process stations, photolithography process stations, CMP process stations, etc. One or more of the processing steps performed by the semiconductor device manufacturing system 710 may be controlled by the process controller 720. The process controller 720 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device manufacturing system 710 may produce semiconductor devices 100 (e.g., integrated circuits) on a medium, such as silicon wafers. The semiconductor device manufacturing system 710 may provide processed semiconductor devices 100 on a transport mechanism 750, such as a conveyor system. In some embodiments, the conveyor system may be sophisticated clean room transport systems that are capable of transporting semiconductor wafers. In one embodiment, the semiconductor device manufacturing system 710 may comprise a plurality of processing steps, e.g., the $1^{st}$ process step, the $2^{nd}$ process step, etc.

In some embodiments, the items labeled "100" may represent individual wafers, and in other embodiments, the items 100 may represent a group of semiconductor wafers, e.g., a "lot" of semiconductor wafers. The semiconductor device 100 may comprise one or more of a transistor, a capacitor, a resistor, a memory cell, a processor, and/or the like. In one embodiment, the semiconductor device 100 comprises a plurality of cells of an array, wherein each of the cells comprises a pass gate and a latch; a plurality of word lines, wherein each word line controls access to each pass gate of a first number of cells; a word line driver electrically connected to each word line; a row decoder configured to authorize or deauthorize a write voltage to each word line through the word line driver, wherein the write voltage is selected from an operational write voltage or a first write voltage; and a control line configured to provide an operational write voltage or a first write voltage to each word line authorized by the row decoder, wherein the first write voltage is greater than an operational write voltage.

The system 700 may be capable of manufacturing various products involving various technologies. For example, the system 700 may produce devices of CMOS technology, Flash technology, BiCMOS technology, power devices, memory devices (e.g., DRAM devices), NAND memory devices, and/or various other semiconductor technologies.

Figure 8:
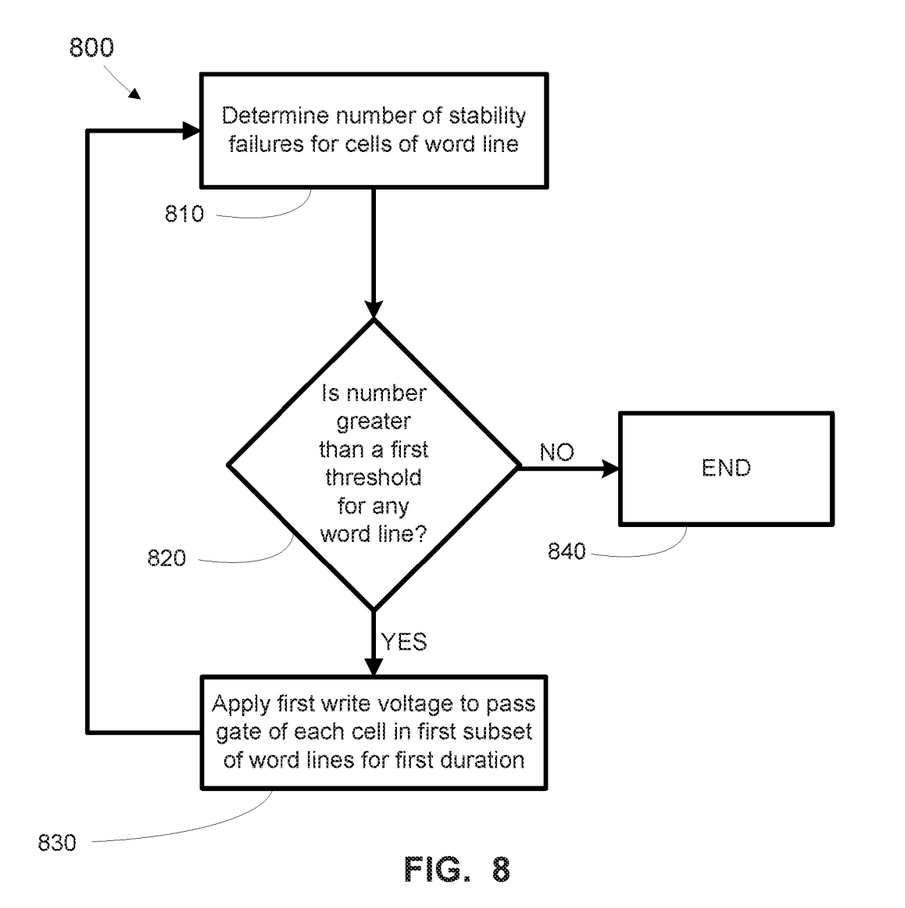
FIG. 8 illustrates a flowchart of a method in accordance with embodiments herein.

Turning to FIG. 8, a flowchart of a method 800 in accordance with embodiments herein is depicted. The method 800 may comprise determining (at 810) a number of stability failures for a plurality of cells 110 of a word line 150, wherein each of the cells 110 comprises a pass gate 120 and a latch 130. If an array 105 comprises a plurality of word lines 150a, 150b, . . . 150n, determining (at 810) may be performed for all word lines 150a, 150b, . . . 150n prior to performing subsequent steps of the method 800.

The method 800 may also comprise determining (at 820) whether the number of stability failures in the word line 150 is greater than a first threshold for any word line 150a, 150b, 150n. The first threshold may be a fixed value or may be dynamically adjusted during the operational lifetime of the semiconductor device in order to optimize the balance between stability failures and write failures. In one embodiment, the first threshold may be zero.

If the determination (at 820) is that the number of stability failures is greater than the first threshold for one or more word lines 150a, 150b, . . . 150n, then the word lines for which this condition is true may be considered a first subset of word lines 150a, 150b, . . . 150n. If the first subset is not empty, then flow of the method 800 may pass to applying (at 830) a first write voltage to the pass gate 120 of each cell 110 of the first subset of word lines for a first duration, wherein the first write voltage is greater than an operational write voltage of the cell. In one embodiment, the first write voltage may be from about 1.1 times the operational write voltage to about 1.8 times the operational write voltage. Independently of the first write voltage, the first duration may be from about 1 sec to about 10 sec.

Figure 9:
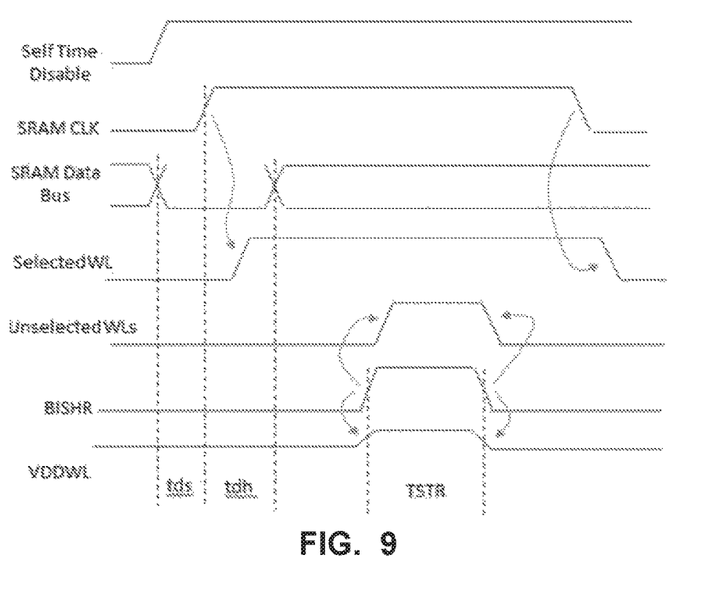
FIG. 9 presents a timing diagram usable in a step of the method shown in FIG. 8 in accordance with embodiments herein.

FIG. 9 depicts a timing diagram that may be used in performing the applying (at 830) the first write voltage. In the depicted timing diagram, all signals expect the WL signals and VCS may be controlled by a tester device/operator. A reversed set of signals may be useful to apply a comparable write voltage to pass gates 140 of each cell.

Figure 10:
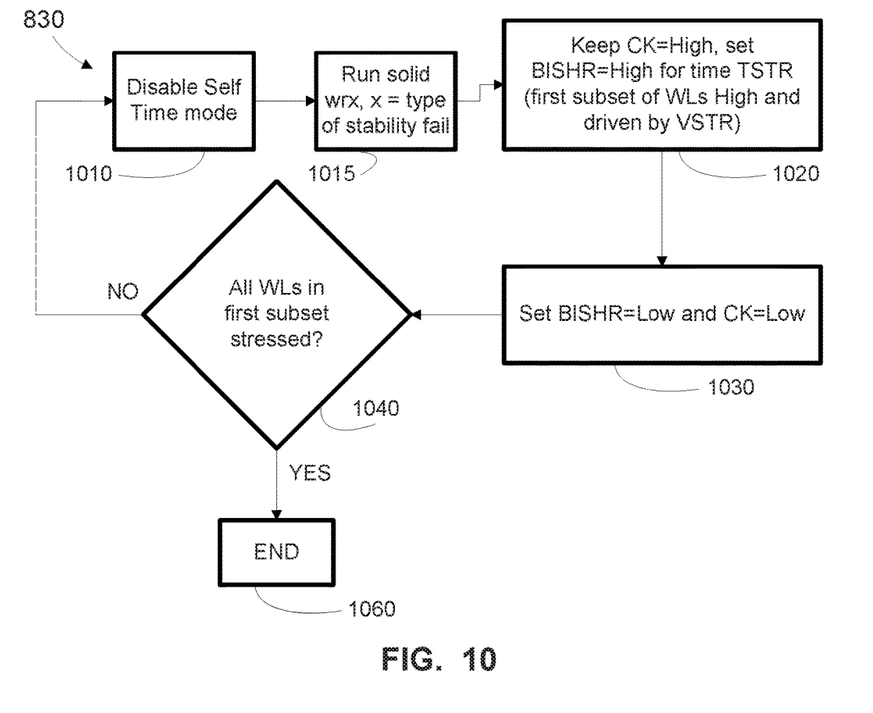
FIG. 10 illustrates a flowchart of a step of the method shown in FIG. 8 in accordance with embodiments herein.

FIG. 10 depicts a flowchart showing one embodiment of the applying (at 830) in more detail. First, at 1010, a self-time mode is disabled. Next, at 1015, solid write x is run, where x has a value corresponding to the type of stability failure in question. For example, if the number of stability failures in a word line for read 0 is greater than the first threshold, a solid write 0 may be run. If the number of stability failures in a word line for read 1 is greater than the first threshold, a solid write 1 may be run.

At 1020, CK is kept High and BISHR is set High for the stress time TSTR. The value of TSTR may be calculated based on one or more of the desired incremental Vt shift in the array 105, the stress voltage VSTR to be applied, and the available BTI models (i.e., PBTI or NBTI). In this embodiment, only the first subset of word lines, i.e., those with a number of stability failures greater than the first threshold, will experience the stress voltage for the stress time.

At 1030, BISHR and CK are both set Low, and a determination is made at 1040 whether all failing rows, i.e., all word lines in the first subset, have been stressed. If so, applying (at 830) may end (block 1060). If no, flow then returns to 1010, and applying at 830 continues until end block 1060 is reached.

Thereafter, flow of the method 800 may return to determining (at 810). The determinations at 810-820 may be repeated, and the application (at 830) repeated, until a determination at 820 finds that the number of stability failures is not greater than the first threshold for any word line.

In the event that the number of stability failures is determined (at 820) to be not greater than (i.e., less than or equal to) the first threshold, the method 800 may end (at 870).

In one embodiment, each of the cells may be a static random access memory (SRAM) cell. In a particular embodiment, each of the SRAM cells may be a six-transistor (6T) SRAM cell.

The method 800 may be performed during semiconductor device manufacturing, such as that depicted in FIG. 7. Alternatively or in addition, a semiconductor device 100 may be configured to perform the method 800 on arrays 105 contained within or in the same system as the semiconductor device 100 at one or more times during the operational life of the semiconductor device 100. For example, if the cells 110 are SRAM cells, if the semiconductor device 100 performs the method 800 during its operational life, the stability and/or yield of the SRAM cells may be maintained at a desirably high level for a longer time than would otherwise be possible.

In one embodiment, the present disclosure may relate to a system, comprising:

a semiconductor device, comprising: a plurality of cells of an array, wherein each of the cells comprises a pass gate and a latch; a plurality of word lines, wherein each word line controls access to each pass gate of a first number of cells; a word line driver electrically connected to each word line; a row decoder configured to authorize or deauthorize a write voltage to each word line through the word line driver, wherein the write voltage is selected from an operational write voltage or a first write voltage; and a control line configured to provide an operational write voltage or a first write voltage to each word line authorized by the row decoder, wherein the first write voltage is greater than an operational write voltage; and a repair controller configured to: determine a number of stability failures for a plurality of cells in each word line of an array, wherein each of the cells comprises a pass gate and a latch; and apply, in response to the number of stability failures in each word line of the first subset being greater than a first threshold, a first write voltage to the pass gate of each cell in a first subset of the word lines for a first duration, wherein the first write voltage is greater than an operational write voltage of the cell.

The methods described above may be governed by instructions that are stored in a non-transitory computer readable storage medium and that are executed by, e.g., a processor in a computing device. Each of the operations described herein (e.g., FIG. 8) may correspond to instructions stored in a non-transitory computer memory or computer readable storage medium. In various embodiments, the non-transitory computer readable storage medium includes a magnetic or optical disk storage device, solid state storage devices such as flash memory, or other non-volatile memory device or devices. The computer readable instructions stored on the non-transitory computer readable storage medium may be in source code, assembly language code, object code, or other instruction format that is interpreted and/or executable by one or more processors.

The particular embodiments disclosed above are illustrative only, as the invention may be modified and practiced in different but equivalent manners apparent to those skilled in the art having the benefit of the teachings herein. For example, the disclosure may be applied to a variety of circuit elements in addition to the 6T SRAM cells described and depicted in particular embodiments of the description and figures. For another example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the invention. Accordingly, the protection sought herein is as set forth in the claims below.

What is claimed is:

1. A method, comprising:
    determining a number of stability failures for a plurality of cells in each word line of an array, wherein each of the cells comprises a pass gate and a latch; and
    applying, in response to the number of stability failures in each word line of the first subset being greater than a first threshold, a first write voltage to the pass gate of each cell in a first subset of the word lines for a first duration, wherein the first write voltage is greater than an operational write voltage of the cell.

2. The method of claim 1, wherein the first threshold is zero.

3. The method of claim 1, wherein each of the cells is a static random access memory (SRAM) cell.

4. The method of claim 3, wherein each of the SRAM cells is a six-transistor (6T) SRAM cell.

5. The method of claim 1, wherein the first write voltage is from about 1.1 times the operational write voltage to about 1.8 times the operational write voltage.

6. The method of claim 1, wherein the first duration is from about 1 sec to about 10 sec.

7. A semiconductor device, comprising:
    a plurality of cells of an array, wherein each of the cells comprises a pass gate and a latch;
    a plurality of word lines, wherein each word line controls access to each pass gate of a first number of cells;
    a word line driver electrically connected to each word line;
    a row decoder configured to authorize or deauthorize a write voltage to each word line through the word line driver, wherein the write voltage is selected from an operational write voltage or a first write voltage; and
    a control line configured to provide an operational write voltage or a first write voltage to each word line authorized by the row decoder, wherein the first write voltage is greater than an operational write voltage; and
    wherein the first write voltage is based on a number of stability failures for the plurality of cells in each word line of the array above a threshold.

8. The semiconductor device of claim 7, wherein the first number of cells is two, four, six, eight, sixteen, thirty-two, or sixty-four.

9. The semiconductor device of claim 7, wherein each cell is a static random access memory (SRAM) cell.

10. The semiconductor device of claim 9, wherein each of the SRAM cells is a six-transistor (6T) SRAM cell.

11. The semiconductor device of claim 7, wherein the first write voltage is from about 1.1 times the operational write voltage to about 1.8 times the operational write voltage.

12. A system, comprising:
    a semiconductor device, comprising:
        a plurality of cells of an array, wherein each of the cells comprises a pass gate and a latch;
        a plurality of word lines, wherein each word line controls access to each pass gate of a first number of cells;
        a word line driver electrically connected to each word line;
        a row decoder configured to authorize or deauthorize a write voltage to each word line through the word line driver, wherein the write voltage is selected from an operational write voltage or a first write voltage; and
        a control line configured to provide an operational write voltage or a first write voltage to each word line authorized by the row decoder, wherein the first write voltage is greater than an operational write voltage; and
    a repair controller configured to:
    determine a number of stability failures for a plurality of cells in each word line of an array, wherein each of the cells comprises a pass gate and a latch; and
    apply, in response to the number of stability failures in each word line of the first subset being greater than a first threshold, a first write voltage to the pass gate of each cell in a first subset of the word lines for a first duration, wherein the first write voltage is greater than an operational write voltage of the cell.

13. The system of claim 12, wherein the first number of cells is two, four, six, eight, sixteen, thirty-two, or sixty-four.

14. The system of claim 12, wherein each cell is a static random access memory (SRAM) cell.

15. The system of claim 14, wherein each of the SRAM cells is a six-transistor (6T) SRAM cell.

16. The system of claim 12, wherein the first threshold is zero.

17. The system of claim 12, wherein the first write voltage is from about 1.1 times the operational write voltage to about 1.8 times the operational write voltage.

18. The system of claim 12, wherein the first duration is from about 1 sec to about 10 sec.

19. The system of claim 12, further comprising:
    a process controller, configured to provide an instruction set for manufacture of the semiconductor device to a manufacturing system;
    the manufacturing system, configured to manufacture the semiconductor device according to the instruction set, wherein the instruction set comprises instructions to:
    form the plurality of cells of an array, wherein each of the cells comprises a pass gate and a latch;
    form the plurality of word lines, wherein each word line controls access to each pass gate of a first number of cells;
    form the word line driver electrically connected to each word line;
    form the row decoder configured to authorize or deauthorize a write voltage to each word line through the word line driver, wherein the write voltage is selected from an operational write voltage or a first write voltage; and
    form the control line configured to provide an operational write voltage or a first write voltage to each word line authorized by the row decoder, wherein the first write voltage is greater than an operational write voltage.

* * * * *